(12) United States Patent
Adkisson et al.

(10) Patent No.: US 6,261,895 B1
(45) Date of Patent: Jul. 17, 2001

(54) POLYSILICON CAPACITOR HAVING LARGE CAPACITANCE AND LOW RESISTANCE AND PROCESS FOR FORMING THE CAPACITOR

(75) Inventors: James W. Adkisson, Jericho; John A. Bracchitta, South Burlington; Jed H. Rankin, Burlington; Anthony K. Stamper, Williston, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/225,043

(22) Filed: Jan. 4, 1999

(51) Int. Cl.[7] .............................................. H01L 21/8242
(52) U.S. Cl. .......................................... 438/240; 438/396
(58) Field of Search ...................................... 438/240, 396

(56) References Cited

U.S. PATENT DOCUMENTS

| | | | |
|---|---|---|---|
| 4,685,197 | * 8/1987 | Tigelaar et al. | 437/195 |
| 4,827,323 | * 5/1989 | Tigelaar et al. | 357/51 |
| 4,866,502 | 9/1989 | Tomaszewski et al. | |
| 5,006,480 | 4/1991 | Chang et al. | |
| 5,434,098 | 7/1995 | Chang | |
| 5,658,821 | 8/1997 | Chen et al. | |
| 5,976,928 | * 11/1999 | Kirlin et al. | 438/240 |

* cited by examiner

*Primary Examiner*—John F. Niebling
*Assistant Examiner*—Lynne Gurley
(74) *Attorney, Agent, or Firm*—Ratner & Prestia; Howard J. Walter, Jr., Esq.

(57) ABSTRACT

A process for forming capacitors in a semiconductor device. In one embodiment, a first insulating layer is deposited on the semiconductor device; a trench is formed in the insulating layer; a first low resistance metal layer is formed covering the interior surface of the trench; a first polysilicon layer is formed over the first low resistance metal layer; a first dielectric layer is formed over the first polysilicon layer; a second polysilicon layer is formed over the first dielectric layer; a second low resistance metal layer is formed over the second polysilicon layer; a third polysilicon layer is formed over the second low resistance metal layer; a second dielectric layer is formed over the third polysilicon layer; a fourth polysilicon layer is formed over the second dielectric layer; a third low resistance metal layer is formed over the fourth polysilicon layer until the trench is filled; the semiconductor device is planarized until the first, second and third low resistance metal layers are exposed above the trench; finally, capacitor leads are formed to the first, second, and third low resistance metal layers.

16 Claims, 4 Drawing Sheets

POLYSILICON CAPACITOR HAVING LARGE CAPACITANCE AND LOW RESISTANCE AND PROCESS FOR FORMING THE CAPACITOR

TECHNICAL FTELD

The present invention relates, in general, to having dense capacitors with low resistance and high capacitance formed in semiconductor devices and, more specifically, to a process for making polysilicon high Q trench capacitors.

BACKGROUND OF THE INVENTION

During the process of making semiconductor devices, capacitors are formed by the application of various steps to selected areas that are to include capacitors. Capacitors can be formed during the front-end-of-the-line (FEOL) processes used to make semiconductor devices. These capacitors have drawbacks, however, such as high resistance and unwanted parasitic capacitance which degrade the tunability (Q) of the capacitor. Capacitors can also be formed during the back-end-of-the-line (BEOL) wiring processes used to make semiconductor devices. These capacitors also have drawbacks, namely the poor quality of deposited insulators on metal resulting in low per unit area capacitance.

Trench capacitors have been developed as a way to achieve cells with larger capacitance values without increasing the area these cells occupy on the chip surface. For example, the silicon area reduction of a trench capacitor compared to a planar capacitor for the same specific capacitance is a factor of 18 or more. Although many of the processing details involved in trench capacitor fabrication are the same as the processing technology of trench isolation structures, there are some unique differences.

There are several differences between the trench structures used for isolation and those used as capacitors. In the former, the dielectric film on the trench walls may be relatively thick, and the trench may be refilled with polysilicon or chemical vapor deposition (CVD) $SiO_2$. In the latter, the insulator formed on the trench walls may serve as the capacitor dielectric and, therefore, it must be as thin as possible. Because the material that refills the trench serves as one plate of the capacitor, it typically consists of highly doped polysilicon. Furthermore, in order to obtain increased capacitance through increases in trench depth, while all other parameters remain constant, the trench walls must be highly vertical. Some trench sidewall slope is usually needed, however, to allow for reliable refilling of the trenches.

Techniques have been tried for achieving a dielectric capacitor film that is thin enough to provide both high capacitance and high reliability. That is, the dielectric must be able to provide the same equivalent breakdown voltage as the planar capacitor. Such composite dielectric films as thermally grown oxide and CVD nitride may be used; thermal oxide films may also present problems. Unless preventative measures are taken, a thinner oxide may grow in the bottom corners and the top corners of the trench. Consequently, a higher electric field may exist across these regions, causing trench capacitors to exhibit higher leakage currents than planar capacitors.

U.S. Pat. No. 5,658,821 issued to Chen et al. describes a process for the formation of capacitors having a polysilicon first capacitor plate, an oxide dielectric, and a metal second capacitor plate which improves uniformity of capacitance and avoids device damage. The process described, however, requires preconditioning of the surface of the polysilicon first capacitor plate to achieve uniform and well-controlled polysilicon oxide formation. The preconditioning requires the additional steps of forming a thin first oxide layer on the polysilicon first capacitor plate. This step is followed by an oxide etch and a dry vertical anisotropic etch. The thin layer of polysilicon oxide is then removed from the polysilicon first capacitor plate, thus conditioning the polysilicon so that subsequent oxide formations may be uniform and well controlled.

The deficiencies of the conventional processes used to make capacitors which are uniform and reliable show that a need still exists for a process which can make uniform and reliable capacitors. Moreover, a need still exists to make high-Q capacitors which do have neither high resistances nor unwanted parasitic capacitance. Furthermore, a need exists to make high-Q capacitors which may be densely formed and have a high per unit area capacitance.

SUMMARY OF THE INVENTTON

To meet these and other needs, and in view of its purposes, the present invention provides a process for forming capacitors in a semiconductor device. The process includes the following steps:

(a) forming a first insulating layer on the semiconductor device, (b) forming a trench in the insulating layer, (c) forming a first low resistance metal layer covering the interior surface of the trench, (d) forming a first polysilicon layer over the first low resistance metal layer, (e) forming a first dielectric layer over the first polysilicon layer, (f) forming a second polysilicon layer over the first dielectric layer, (g) forming a second low resistance metal layer over the second polysilicon layer, (h) forming a third polysilicon layer over the second low resistance metal layer, (i) forming a second dielectric layer over the third polysilicon layer, (j) forming a fourth polysilicon layer over the second dielectric layer, (k) forming a third low resistance metal layer over the fourth polysilicon layer until the trench is filled, (l) planarizing the semiconductor device wherein the first, second, and third low resistance metal layers are exposed above the trench, and (m) forming capacitor leads to the first, second, and third low resistance metal layers.

It is to be understood that both the foregoing general description and the following detailed description are exemplary, but are not restrictive, of the invention.

BRIEF DESCRIPTTON OF THE DRAWING

The invention is best understood from the following detailed description when read in connection with the accompanying drawing. Included in the drawing are the following figures.

DETAILED DESCRIPTION OF THE INVENTION

Figure 1:
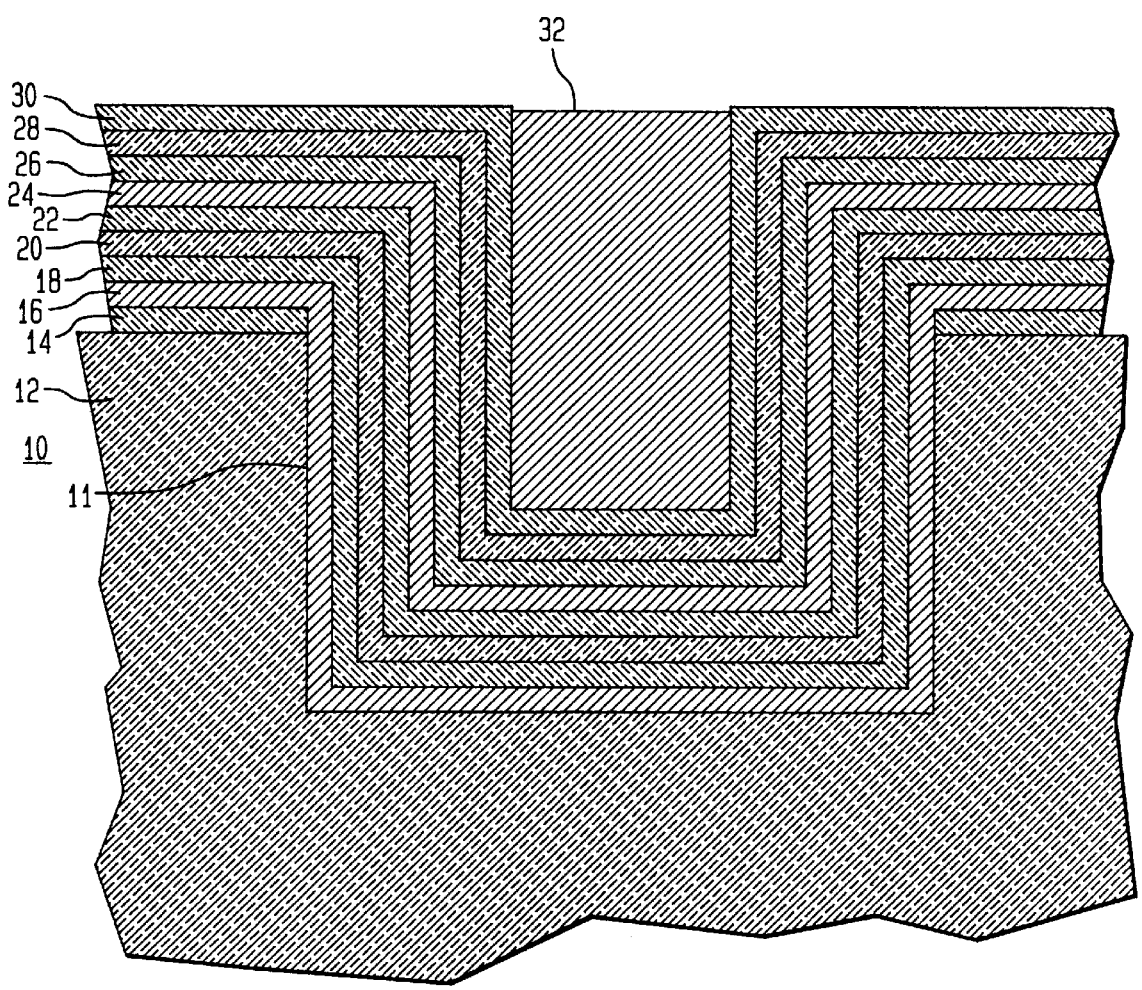
FIG. 1 is a cross-sectional view of a polysilicon trench capacitor structure formed in a semiconductor device after all the films have been deposited in the trench.
Figure 2:
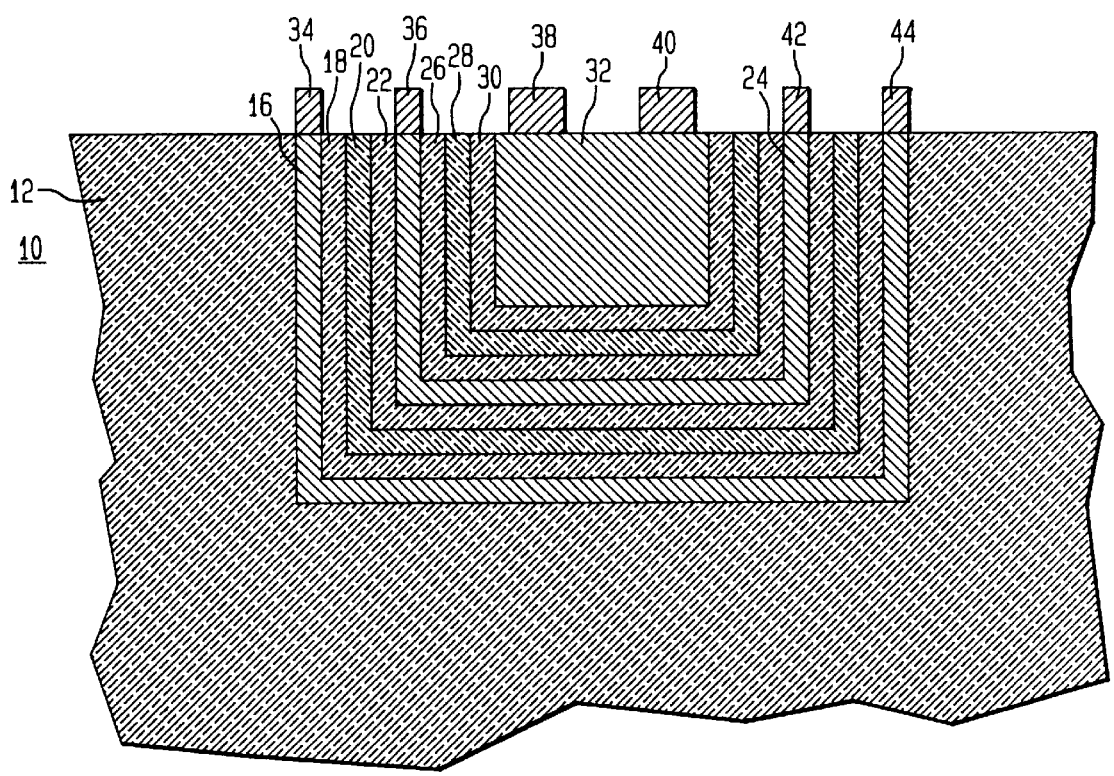
FIG. 2 is a cross-sectional view of the polysilicon trench capacitor of FIG. 1 after chemical-mechanical polish (CMP) planarization and the addition of contact tabs to the capacitor plates.
Figure 3:
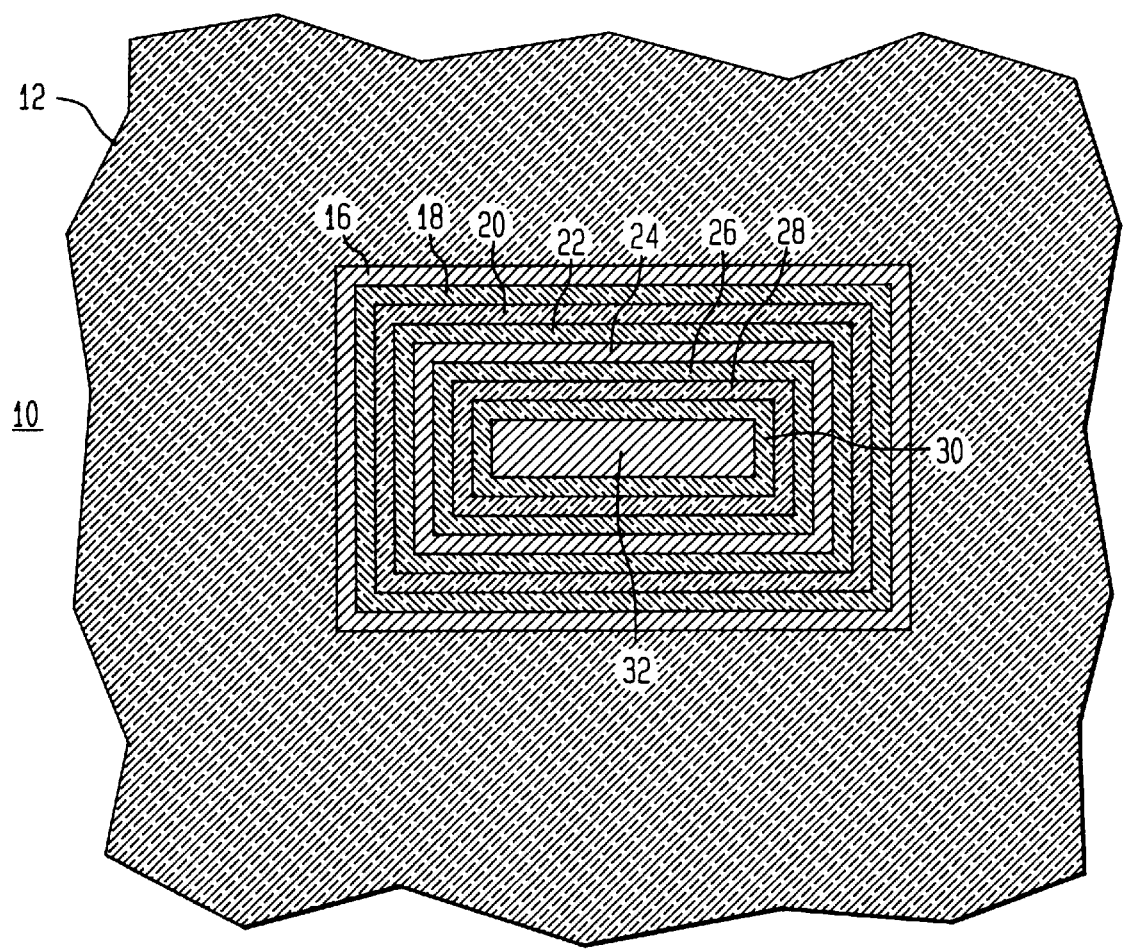
FIG. 3 is a top plan view of the polysilicon trench capacitor of FIG. 2.

In the following detailed description and in the figures of the drawing, like elements are identified with like reference numerals. Referring now to FIGS. 1–3, shown is a polysilicon trench capacitor structure filled with the multilayer films of the present invention. As is well understood in the art, trench 11 is patterned and etched in a standard insulating layer, such as interlevel dielectric (ILD) layer 12 of semiconductor device 10. Trench 11 may also be patterned and etched in a standard interlevel metal dielectric (IMD). Moreover, trench 11 may be formed in areas not containing wiring or vias. An optional antireflective coating (ARC) 14, such as spin-on-dielectric, may also be deposited prior to the trench formation.

First plate 16 of the capacitor is formed from a low resistance metal. For example, the first plate may be formed by depositing titanium nitride or tantalum nitride over the entire interior surface of trench 11, followed by sputtered tungsten and CVD tungsten. In this manner, first plate 16 forms a conductor having low resistance characteristics. The tungsten also permits high temperature annealing greater than 600° C. The next layer is formed from polysilicon, and is shown as first polysilicon layer 18. The polysilicon preferably is in-situ doped, with a P-type or N-type dopant. Ion implantation could also be used to dope the polysilicon. The polysilicon is followed by an insulator material which forms first capacitor dielectric 20. The insulator material may be made from an $SiO_2$ layer, followed by an $Si_3N_4$ layer and another $SiO_2$ layer (or ONO layers). Optionally, a single $SiO_2$ layer could be formed by oxidizing the polysilicon surface. On top of first capacitor dielectric 20 another polysilicon insitu-doped layer is formed, shown as second polysilicon layer 22. Thus, first capacitor dielectric 20 is sandwiched between first polysilicon layer 18 and second polysilicon layer 22.

The stacking of layers described above may be repeated. A second low resistance metal layer is formed by depositing titanium nitride or tantalum nitride, followed by sputtered tungsten and CVD tungsten. In this manner, second plate 24 forms a second conductor having low resistance characteristics. The next layer is again formed from insitu-doped polysilicon, and is shown as third polysilicon layer 26. The polysilicon is then followed by an insulator material which forms second capacitor dielectric 28. As before, second capacitor dielectric 28 may be made from ONO, or $SiO_2$. On top of second capacitor dielectric 28 another polysilicon layer is formed, shown as fourth polysilicon layer 30. Thus, second capacitor dielectric 28 is sandwiched between third polysilicon layer 26 and fourth polysilicon layer 30.

Finally, a third low resistance metal layer may be formed by depositing titanium nitride or tantalum nitride, followed by sputtered tungsten and CVD tungsten. The deposition is continued until trench 11 is completely filled, as shown by third capacitor plate 32. As mentioned before, the tungsten permits annealing at high temperatures of greater than 600° C.

As is well known in the art, the multilayer films of FIG. 1 are chemical mechanical polished or etched all the way down to ILD layer 12, past ARC 14. A non-selective chemical-mechanical polish may be used to polish down to the titanium nitride layer and a selective chemical-mechanical polish may be used to polish down to the optional ARC layer. The optional ARC layer may then be finally polished.

It is preferable that standard isolation trench CMP methods, such as patterned photo resist or polysilicon fill-in of low areas prior to CMP, may be used.

Referring to FIG. 2, first capacitor plate 16, second capacitor plate 24, and third capacitor plate 32 are shown coplanar with a surface of ILD layer 12, and above trench 11. Next, multiple contact tabs, such as tabs 34, 36, 38, 40, 42 and 44, may be formed to connect the capacitor plates to capacitor leads (not shown) using standard wiring techniques. This may be done by forming another ILD layer (not shown) on top of the capacitor structure of FIG. 2. Using conventional patterning and etching techniques, vias (or contact tabs) may be formed on top of first capacitor plate 16, second capacitor plate 24, and third capacitor plate 32.

Having formed first capacitor plate 16, second capacitor plate 24, and third capacitor plate 32 as described, several capacitors may now be available from semiconductor device 10. For example, one capacitor may be formed from first capacitor plate 16, first capacitor dielectric 20, and second capacitor plate 24. Another capacitor may be formed from second capacitor plate 24, second capacitor dielectric 28, and third capacitor plate 32. Yet another capacitor may be formed between second capacitor plate 24 and first and third capacitor plates 16 and 32 (the first and third capacitor plates are shorted together).

Another view of the multilayer capacitor structure may be seen in FIG. 3. FIG. 3 is a top view of the trench capacitor after a chemical-mechanical polish has been performed. Because of the multilayers of the capacitor structure, the shown capacitor may also be known as a damascene capacitor structure.

Figure 4:
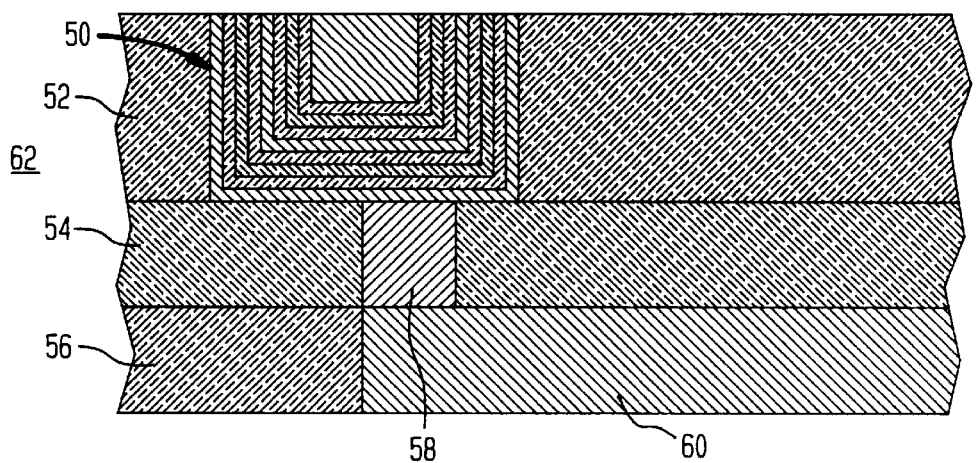
FIG. 4 is a cross-sectional view of a trench capacitor having been formed above a metal via.

FIG. 4 shows another embodiment of the damascene capacitor structure. As shown, trench capacitor 50 is formed in dielectric layer 52 of semiconductor device 62. Lower dielectric layers 54 and 56 contain metal via 58 and metal wire 60, respectively. In this manner, the bottom plate of trench capacitor 50 is in electrical contact with metal via 58 and metal wire 60.

Figure 5:
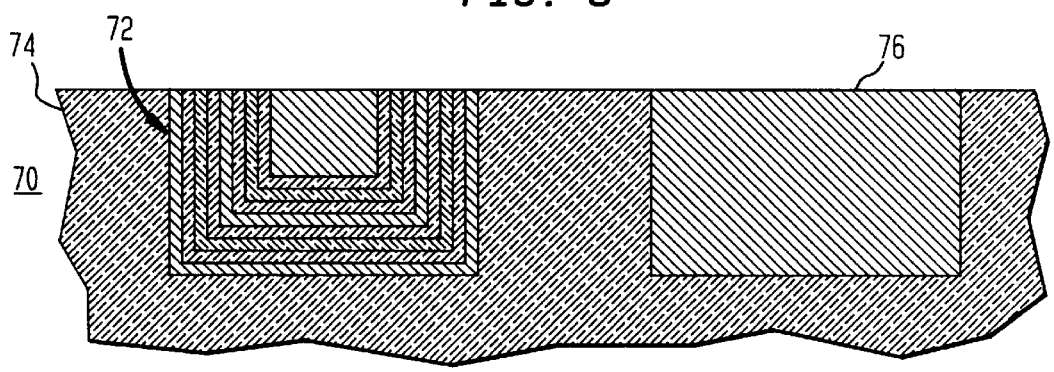
FIG. 5 is a cross-sectional view of a trench capacitor having been formed coplanar with a metal wire.

FIG. 5 shows yet another embodiment of the damascene capacitor structure. As shown, trench capacitor 72 has been formed in dielectric layer 74 of semiconductor device 70 and coplanar with metal wire 76, the latter being fabricated in a separate process.

Figure 6:
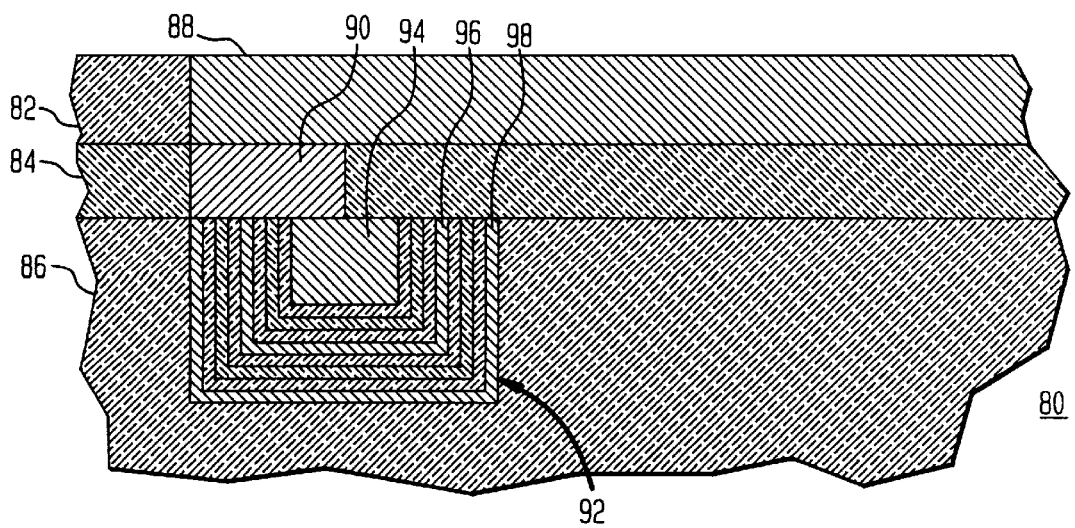
FIG. 6 is a cross-sectional view of a metal via having been formed above a trench capacitor.

FIG. 6 shows still another embodiment of the damascene capacitor structure. As shown, trench capacitor 92 is formed in dielectric layer 86 of semiconductor device 80. Upper dielectric layers 82 and 84 contain metal wire 88 and metal via 90, respectively. Metal via 90 is in electrical contact with three capacitor plates, namely first conductor plate 98, second conductor plate 96 and third conductor plate 94. In this manner, trench capacitor 92 is used as a wiring level.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. It will be understood, for example, that the present invention is not limited to the three capacitor plates shown herein. Rather, the invention may be extended to more than three plates or it may be extended to only two plates. The main feature of this invention is that the dielectric is sandwiched between two polysilicon layers. In this manner, a high-Q capacitor is formed having a high per unit area capacitance and low resistance metal plates.

It will be further understood that the present invention my be extended to a different combination of materials to form the low resistance plates so long as the low resistance metal layer is able to withstand high annealing temperatures. Furthermore, different dielectric materials may be used without departing from the spirit and scope of the invention. For example, capacitor dielectric 20 or 28 may be formed from high dielectric constant materials, such as $Ta_2O_5$, to increase the capacitance.

What is claimed:

1. A process for forming a three plated capacitor in a semiconductor device comprising the steps of:
    (a) forming a first insulating layer on the semiconductor device;
    (b) forming a trench defined by an interior surface in the insulating layer;
    (c) forming a first low resistance metal layer covering the interior surface of the trench;
    (d) forming a first polysilicon layer directly over and in contact with the first low resistance metal layer;
    (e) forming a first dielectric layer directly over and in contact with the first polysilicon layer;
    (f) forming a second polysilicon layer directly over and in contact with the first dielectric layer;
    (g) forming a second low resistance metal layer over the second polysilicon layer;
    (h) forming a third polysilicon layer directly over and in contact with the second low resistance metal layer;
    (i) forming a second dielectric layer directly over and in contact with the third polysilicon layer;
    (j) forming a fourth polysilicon layer directly over and in contact with the second dielectric layer;
    (k) forming a third low resistance metal layer over the fourth polysilicon layer until the trench is filled;
    (l) planarizing the semiconductor device wherein the first, second, and third low resistance metal layers are exposed above the trench; and
    (m) forming capacitor leads to the first, second, and third low resistance metal layers.

2. The process of claim 1 wherein the first and second low resistance metal layers are each formed by depositing one of a titanium nitride layer and a tantalum nitride layer, followed by a sputtered tungsten layer and a CVD tungsten layer.

3. The process of claim 2 wherein the first, second, third and fourth polysilicon layers are each insitu-doped with one of a P-type dopant and an N-type dopant.

4. The process of claim 3 wherein the first and second dielectric layers are each formed by depositing a layer of $SiO_2$, followed by a layer of $Si_3N_4$ and another layer of $SiO_2$.

5. The process of claim 3 wherein the first and second dielectric layers are each of $SiO_2$, formed by oxidizing the polysilicon layer below the respective first and second dielectric layers.

6. The process of claim 3 wherein step (m) includes forming vias on top of the first, second and third low resistance metal layers.

7. The process of claim 6 wherein step (a) includes forming a metal via below the first insulating layer for electrically contacting the first low resistance metal layer.

8. The product produced by the process of claim 1.

9. A process for forming a two plated capacitor in a semiconductor device comprising the steps of:
    (a) forming a first insulating layer on the semiconductor device;
    (b) forming a trench defined by an interior surface in the insulating layer;
    (c) forming a first low resistance metal layer covering the interior surface of the trench;
    (d) forming a first polysilicon layer directly over and in contact with the first low resistance metal layer;
    (e) forming a dielectric layer directly over and in contact with the first polysilicon layer;
    (f) forming a second polysilicon layer directly over and in contact with the first dielectric layer;
    (g) forming a second low resistance metal layer over the second polysilicon layer until the trench is filled;
    (h) planarizing the semiconductor device wherein the first and second low resistance metal layers are exposed above the trench; and
    (i) forming capacitor leads to the first and second low resistance metal layers.

10. The process of claim 9 wherein the first low resistance metal layer is formed by depositing one of a titanium nitride layer and a tantalum nitride layer, followed by a sputtered tungsten layer and a CVD tungsten layer.

11. The process of claim 10 wherein the first and second polysilicon layers are each insitu-doped with one of a P-type dopant and an N-type dopant.

12. The process of claim 11 wherein the dielectric layer is formed by depositing a layer of $SiO_2$, followed by a layer of $Si_3N_4$ and another layer of $SiO_2$.

13. The process of claim 11 wherein the first dielectric layer is $SiO_2$, formed by oxidizing the polysilicon layer below the first dielectric layer.

14. The process of claim 11 wherein step (i) includes forming vias on top of the first and second low resistance metal layers.

15. The process of claim 14 wherein step (a) includes forming a metal via below the first insulating layer for electrically contacting the first low resistance metal layer.

16. The process of claim 15 wherein the dielectric layer may be formed from $Ta_2O_5$.

* * * * *